US009399812B2

(12) United States Patent
Bodke et al.

(10) Patent No.: US 9,399,812 B2
(45) Date of Patent: Jul. 26, 2016

(54) METHODS OF PREVENTING PLASMA INDUCED DAMAGE DURING SUBSTRATE PROCESSING

(75) Inventors: Ashish Subhash Bodke, San Jose, CA (US); Zhigang Xie, Sunnyvale, CA (US); Mei Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 15 days.

(21) Appl. No.: 13/270,276

(22) Filed: Oct. 11, 2011
(Under 37 CFR 1.47)

(65) Prior Publication Data

US 2013/0087447 A1    Apr. 11, 2013

(51) Int. Cl.
| C23C 14/00 | (2006.01) |
| C23C 14/32 | (2006.01) |
| C23C 14/04 | (2006.01) |
| C23C 14/06 | (2006.01) |
| C23C 14/16 | (2006.01) |
| C23C 14/34 | (2006.01) |
| H01L 21/683 | (2006.01) |

(52) U.S. Cl.
CPC ........... *C23C 14/046* (2013.01); *C23C 14/0641* (2013.01); *C23C 14/165* (2013.01); *C23C 14/3492* (2013.01); *H01L 21/6831* (2013.01)

(58) Field of Classification Search
CPC  C23C 14/046; C23C 14/0641; C23C 14/165; C23C 14/3492; H01L 21/6831
USPC ...................................................... 204/192.1
See application file for complete search history.

(56) References Cited

U.S. PATENT DOCUMENTS

| 5,049,251 | A | * | 9/1991 | Inoue ....................... 204/192.12 |
| 5,976,327 | A | * | 11/1999 | Tanaka ..................... 204/192.15 |
| 6,193,855 | B1 | * | 2/2001 | Gopalraja et al. ........ 204/192.12 |
| 6,413,383 | B1 | * | 7/2002 | Chiang et al. ............. 204/192.13 |
| 2001/0002871 | A1 | * | 6/2001 | Nagao et al. .................. 361/234 |
| 2002/0029958 | A1 | * | 3/2002 | Chiang et al. .............. 204/192.1 |
| 2002/0086527 | A1 | * | 7/2002 | Schmidbauer et al. ........ 438/653 |
| 2006/0189060 | A1 | * | 8/2006 | Chen ............................. 438/199 |
| 2007/0009670 | A9 | * | 1/2007 | Haag ............................. 427/458 |

FOREIGN PATENT DOCUMENTS

EP           1076110 A1 *  2/2001  .............. C23C 14/35

\* cited by examiner

*Primary Examiner* — Ibrahime A Abraham
(74) *Attorney, Agent, or Firm* — Moser Taboada; Alan Taboada

(57) ABSTRACT

Methods for processing substrates are provided herein. In some embodiments, a method of processing a substrate within a process chamber having an electrostatic chuck to support a substrate in a processing region of the process chamber and a target disposed opposite the electrostatic chuck, wherein the target comprises a target material to be deposited on the substrate, may include disposing a substrate on the electrostatic chuck; providing a process gas to the processing region; igniting a plasma in the processing region from the process gas while the substrate is disposed on the electrostatic chuck with no chucking voltage provided to clamp the substrate to the electrostatic chuck; and depositing target material on the substrate to form a first barrier layer while no chucking voltage is provided, wherein the target material is sputtered from the target via the plasma.

16 Claims, 4 Drawing Sheets

METHODS OF PREVENTING PLASMA INDUCED DAMAGE DURING SUBSTRATE PROCESSING

FIELD

The present invention generally relates to the processing of semiconductor substrates, and more particularly, to methods of reducing plasma induced damage to substrates during processing.

BACKGROUND

Interconnect structures of integrated circuits and semiconductor devices are typically fabricated by forming a series of dielectric layers and conductive layers in order to create a three dimensional network of conductive layers separated by dielectric material. The interconnect structure may be fabricated using, for example, a damascene structure in which a dielectric layer such as a low k dielectric layer is formed atop one or more conductive plugs or sub-layers. In order to form an electrical connection to the conductive sub-layers, the dielectric is patterned and etched to define via openings in the dielectric layer. Formation of the via openings within the dielectric layer exposes a portion of the conductive line. Therefore, reliable formation of these interconnect features is an important factor in ensuring the quality, performance and reliability of devices formed on individual substrates and in each die.

A typical method for forming layers for such interconnection structures includes physical vapor deposition of a barrier layer over a feature, such as a trench or a via, followed by a physical vapor deposition of a metal layer on the barrier layer to fill the feature. One common material often utilized to fabricate the barrier layer is titanium. However, the inventors have observed that achieving the desired coverage of the barrier layer material on the bottom surfaces of the substrate features is increasingly difficult in processes involving smaller features and high aspect ratios (e.g., a ratio of height to width of the feature). For example, the inventors have observed that conventional titanium physical vapor deposition techniques that utilize process conditions bombard the substrate with the deposition material to try to achieve a desired bottom coverage may lead to damage of underlying dielectric layers due to the intensity of the bombardment. This may lead to yield loss, deterioration in reliability and device failure.

Thus, the inventors have provided improved methods for processing semiconductor substrates.

SUMMARY

Methods for processing substrates are provided herein. In some embodiments, a method of processing a substrate within a process chamber having an electrostatic chuck to support a substrate in a processing region of the process chamber and a target disposed opposite the electrostatic chuck, wherein the target comprises a target material to be deposited on the substrate, the method may include disposing a substrate on the electrostatic chuck; providing a process gas to the processing region; igniting a plasma in the processing region from the process gas while the substrate is disposed on the electrostatic chuck with no chucking voltage provided to clamp the substrate to the electrostatic chuck; and depositing target material on the substrate to form a first barrier layer while no chucking voltage is provided, wherein the target material is sputtered from the target via the plasma.

In some embodiments, a method of processing a substrate within a process chamber having an electrostatic chuck to support a substrate in a processing region of the process chamber and a target disposed opposite the electrostatic chuck, wherein the target comprises a target material to be deposited on the substrate, may include disposing a substrate on the electrostatic chuck; providing a process gas to the processing region; igniting a plasma in the processing region from the process gas while the substrate is disposed on the electrostatic chuck with no chucking voltage provided to clamp the substrate to the electrostatic chuck; depositing a first layer of target material on the substrate while no chucking voltage is provided, wherein the target material is sputtered from the target via the plasma; and depositing a second layer of target material on the substrate while a chucking voltage is provided to the electrostatic chuck and while applying a backside gas to the substrate to control a temperature of the substrate, wherein the target material is sputtered from the target via the plasma.

In some embodiments, a method of processing a substrate within a process chamber having an electrostatic chuck to support a substrate in a processing region of the process chamber and a target disposed opposite the electrostatic chuck, wherein the target comprises a target material to be deposited on the substrate, may include disposing a substrate on the electrostatic chuck; providing a process gas to the processing region; igniting a plasma in the processing region from the process gas while the substrate is disposed on the electrostatic chuck with no chucking voltage provided to clamp the substrate to the electrostatic chuck; depositing a first layer of target material on the substrate while no chucking voltage is provided, wherein the target material is sputtered from the target via the plasma; and depositing a second layer of target material on the substrate while pulsing chucking voltage to the electrostatic chuck and while pulsing a backside gas to the substrate to control substrate temperature levels wherein the target material is sputtered from the target via the plasma.

Other embodiments and variations are disclosed below.

BRIEF DESCRIPTION OF THE DRAWINGS

The teachings of the present invention can be readily understood by considering the following detailed description in conjunction with the accompanying drawings. It is to be noted, however, that the appended drawings illustrate only exemplary embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally provide methods for depositing target material to form barrier layers during substrate processing while advantageously preventing or limiting plasma induced damage to the substrate or structures formed on the substrate. The barrier layer may be utilized in various applications, such as for fabrication of semiconductor devices or integrated circuits. The inventive methods may be utilized to deposit barrier layers on and within substrate features which provide desired coverage of feature surfaces while reducing damage to the underlying substrate layers typically caused by conventional deposition techniques, thereby improving the integrity and reliability of the devices.

Figure 1:
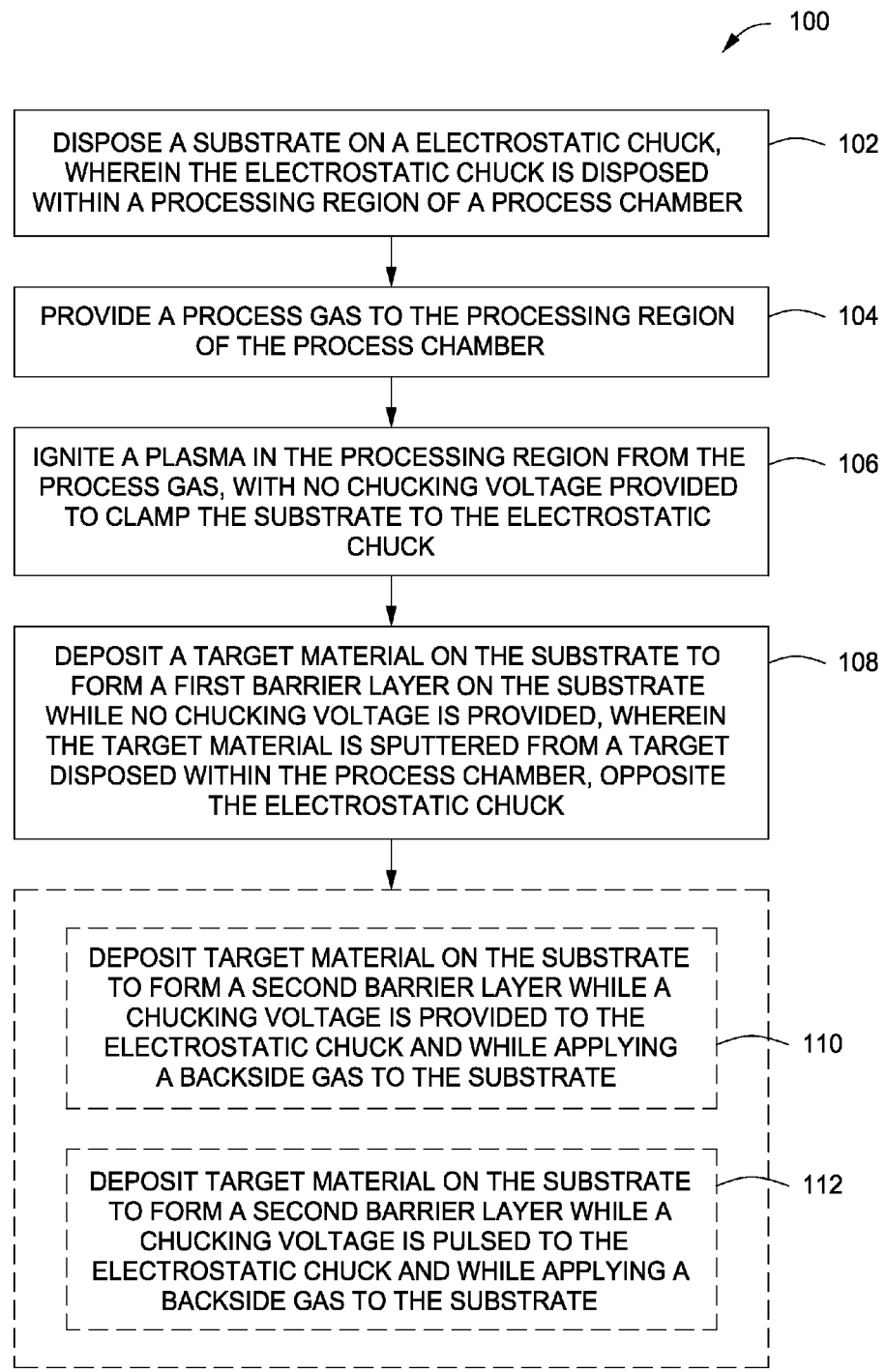
FIG. 1 is a flow diagram of the process of preventing plasma induced damage in substrate processing in accordance with some embodiments of the present invention.
Figure 2A:
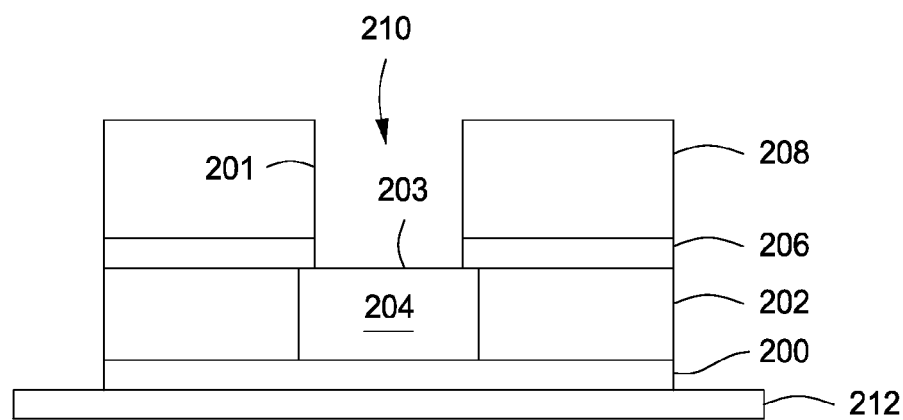
FIGS. 2A-F are cross-sectional views of a substrate during stages of fabrication in accordance with some embodiments of the present invention.

FIG. 1 is a flow diagram of one embodiment of a method 100 for depositing target material to form a barrier layer in accordance with some embodiments of the present invention. FIGS. 2A-F are schematic sectional views of exemplary embodiments of depositing target material to form barrier layers upon a substrate in accordance with some embodiments of the present invention. FIG. 3 depicts a schematic, cross-section view of an illustrative process chamber that may be used to deposit target material upon a substrate in accordance with some embodiments of the present invention.

The method 100 begins at 102 by disposing a substrate on a electrostatic chuck, wherein the electrostatic chuck is disposed within the processing region of a process chamber. The process chamber may be any suitable process chamber having a target comprising a target material to be deposited via a physical vapor deposition (PVD) process (such as the process chamber 300 described below with respect to FIG. 3). In some embodiments, the target may comprise titanium. In some embodiments the target may comprise other materials, such as tantalum (Ta), tungsten (W), or aluminum (Al).

The substrate 200 may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer (e.g., a 200 mm, 300 mm, or the like silicon wafer).

In some embodiments, as depicted in FIGS. 2A-2E, the substrate 200, disposed upon electrostatic chuck 212, may include a dielectric bulk insulating layer 208 and an underlying dielectric barrier layer 206 stacked on a previously formed interconnect having a first conductive layer 204 embedded in another dielectric bulk insulating layer 202. A via/trench etching process may be performed to define a feature 210 in the dielectric bulk insulating layer 208, wherein the feature is delineated at least in part by sidewalls 201 and a bottom 203, and the dielectric barrier layer 206, thereby exposing an upper surface of the first conductive layer 204. In some embodiments, the feature 210 may have a height-to-width aspect ratio of greater than or equal to about 6:1. Alternatively or in combination, other configurations of layers and materials may also be formed on the substrate 200.

Next, at 104 and 106, respectively, a process gas is provided to the processing region of the process chamber described at FIG. 3 and a plasma is ignited from the process gas. The process gas from which the plasma is ignited may include one or more reactive gases and, optionally, one or more non-reactive gases. For example, in embodiments where a metal nitride is being formed, the reactive gases may include a nitrogen-containing gas. Suitable examples of nitrogen-containing gases include nitrogen ($N_2$), nitrous oxide ($N_2O$), nitrogen dioxide ($NO_2$), ammonia ($NH_3$), or the like. In some embodiments, a non-reactive gas may be supplied in the process gas to facilitate maintaining the plasma and/or providing additional ions to the plasma that may be accelerated towards the target to assist sputtering the source material from the target. Examples of non-reactive gases include, but are not limited to, argon (Ar), helium (He), xenon (Xe), krypton (Kr), and the like.

In some embodiments, the process gas supplied into the process chamber 300 may include nitrogen ($N_2$) at a flow rate of about 20 sccm to about 1000 sccm, such as at about 90 sccm to about 200 sccm, or, for example, at about 100 sccm to about 120 sccm. In some embodiments, together with the nitrogen ($N_2$) discussed above, argon (Ar) may be provided into the processing chamber 200 at a flow rate of about 0 sccm to about 1000 sccm, such as at about 2 sccm to about 50 sccm, or, for example, at about 4 sccm to about 10 sccm.

In some embodiments, a lower flow of the nitrogen-containing gas may be provided to perform a metallic PVD process (so-called because the target substantially resists reacting with the reactive gas to form compounds on the surface of the target). In some embodiments, a metallic PVD process may be performed by providing nitrogen ($N_2$) at a flow rate of about 1 sccm to about 70 sccm, such as at about 20 sccm to about 70 sccm, or, for example, at about 60 sccm to about 70 sccm. In some embodiments, together with the nitrogen ($N_2$) discussed above, argon (Ar) may be provided into the processing chamber 200 at a flow rate of about 0 sccm to about 1000 sccm, such as at about 2 sccm to about 10 sccm, or, for example, at about 4 sccm to about 8 sccm.

In some embodiments, a higher flow rate of the nitrogen-containing gas may be provided to perform a poison PVD process (so-called because the target reacts with the reactive gas to form compounds on the surface of the target). In some embodiments, a poison PVD process may be performed by providing nitrogen ($N_2$) at a flow rate of about 80 sccm to about 150 sccm, such as at about 90 sccm to about 100 sccm, or, for example, at about 100 sccm to about 110 sccm. In some embodiments, together with the nitrogen ($N_2$) discussed above, argon (Ar) may be provided into the processing chamber 200 at a flow rate of about 0 sccm to about 100 sccm, such as at about 6 sccm to about 10 sccm, or, for example, at about 8 sccm to about 10 sccm.

In some embodiments, the plasma may be ignited while maintaining the pressure in the process chamber 300 at about 2 to about 100 mTorr. Maintaining such a pressure in the process chamber 300 during plasma ignition limits the voltage applied to the substrate 200, thus reducing a sudden high energy ion bombardment to the substrate 200, ultimately preventing damage to the substrate 200. In some embodiments, the pressure may be maintained for a period of time of about 3 to about 10 seconds to facilitate deposition of a portion of a barrier layer from the target material 214. In some embodiments, the pressure in the process chamber is reduced from the initial pressure at plasma ignition to a pressure of about 2 to about 5 mTorr. In some embodiments, the pressure in the process chamber may be reduced at a rate of about 0.5 to about 1 mTorr/s to avoid sudden high energy ion bombardment of the substrate 200.

A DC plasma ignition power may be applied to the target to ignite the plasma. In some embodiments, the DC plasma ignition power provided is about 0.2 to about 5 kW. The DC plasma ignition power may be applied to the target at a gradual rate to prevent defects forming on the substrate due to shocking the substrate with a sudden high voltage. In some embodiments, the DC plasma ignition power may be provided at a rate of about 2 to about 6 kW/s.

In some embodiments, a DC power of about 10 to about 120 kW may be supplied to the target during deposition to maintain the plasma formed from the process gas in the process chamber 300. Ions from the plasma of the process gas sputter off material from the target, which deposits on the substrate 200. In some embodiments, the DC power applied to the target is increased from the initial DC plasma ignition power at a rate of about 2 to about 6 kW/s to prevent a sudden bombardment of the substrate 200, thus reducing the risk of damaging the underlying layers.

Figure 2B:
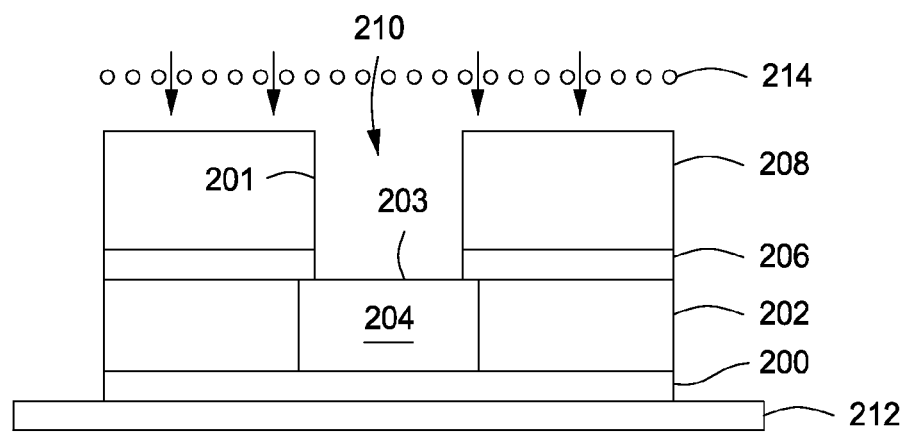
Figure 2C:
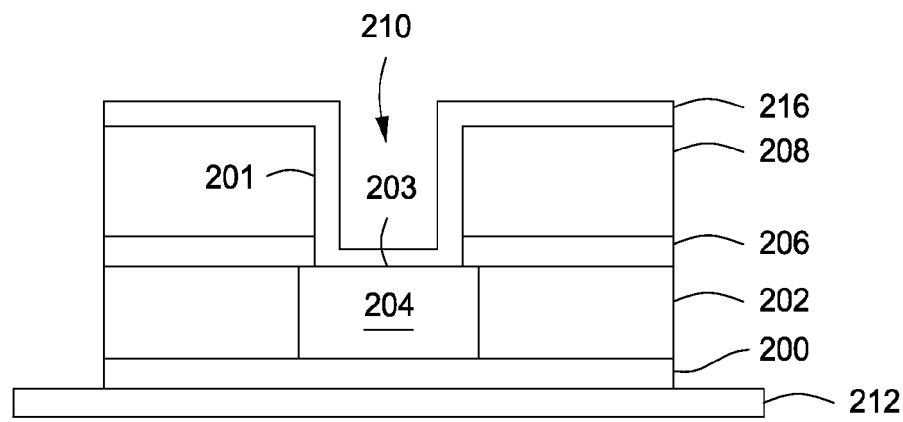
Figure 3:
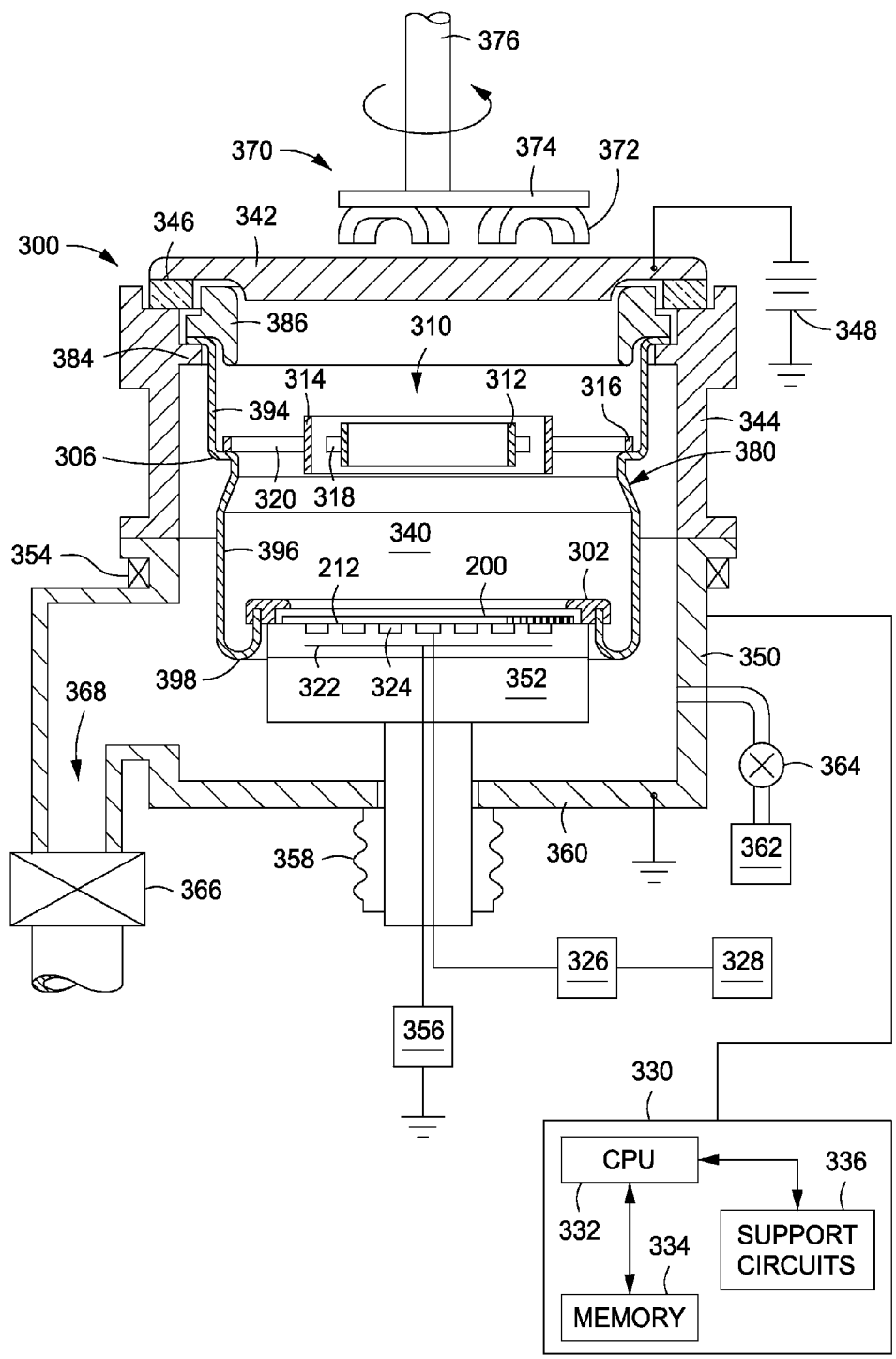
FIG. 3 depicts a schematic, cross-section view of an illustrative process chamber that may be used to deposit a barrier layer in accordance with some embodiments of the present invention.

Next, at 108, target material 214 is deposited on the substrate 200 by sputtering material from the target via the plasma, as depicted in FIG. 2B. As shown in FIG. 2C, a first barrier layer 216 of target material 214 is formed upon any layers or structures disposed on the substrate 200 (such as the first conductive layer 204) and within any features etched in the layers (such as feature 210). The first barrier layer 216 is deposited on the substrate 200 with no chucking voltage provided to clamp the substrate 200 to the electrostatic chuck 212. By maintaining a zero chucking voltage, ions that are sputtered off the target do not accelerate towards the substrate 200 with sufficient energy to cause damage to the substrate 200 or layers and structures in the substrate 200.

Figure 2D:
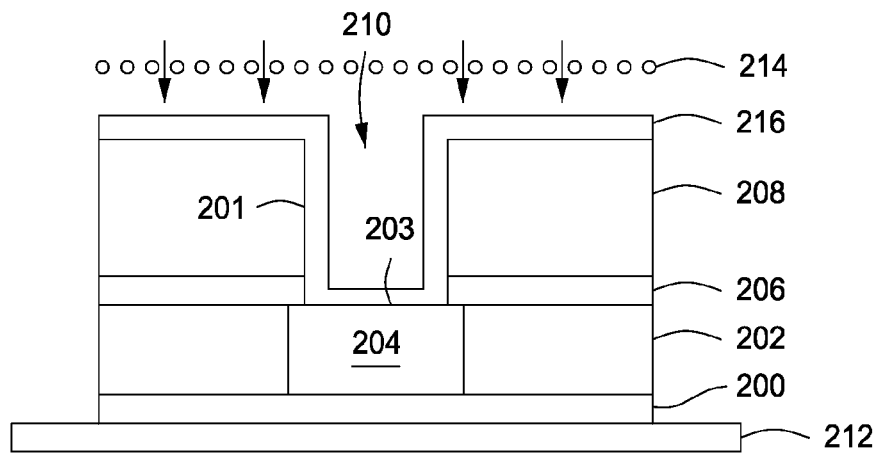
Figure 2E:
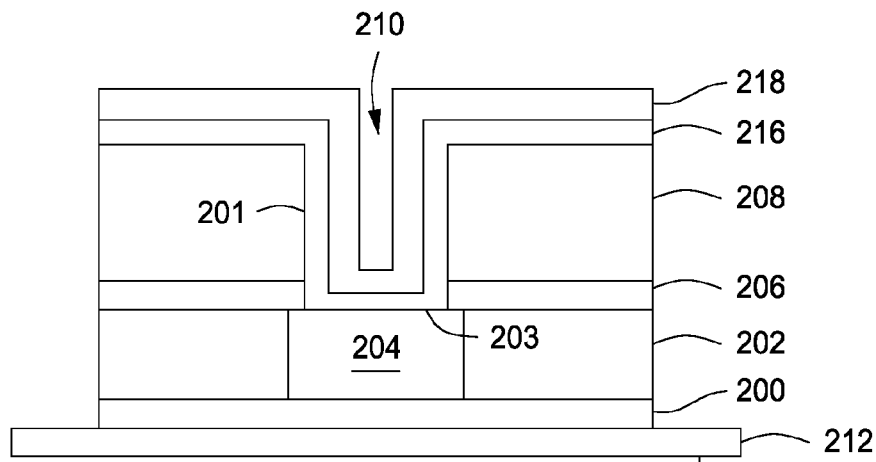
Figure 2F:
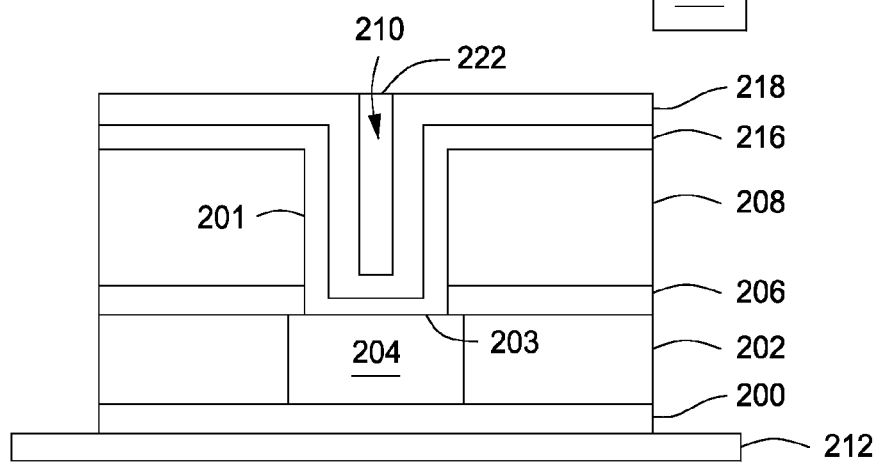

In some embodiments, as seen in FIGS. 2D and 2E, a second barrier layer 218 of target material 214 may be deposited atop the first barrier layer 216. In some embodiments, as depicted at 110, the second barrier layer 218 is deposited while a chucking voltage is provided from a power source 220 to clamp the substrate to the electrostatic chuck 212. In some embodiments, as depicted at 112, the second barrier layer 218 is deposited while a chucking voltage is pulsed from a power source 220 to clamp and unclamp the substrate 200 to the electrostatic chuck 212. By applying a constant chucking voltage, as in 110, or by pulsing the chucking voltage, as in 112, ions are drawn to the substrate 200 with sufficient energy to facilitate sufficient coverage of the bottom 203 and sidewalls 201 of the feature 210. In some embodiments, a backside gas is applied to the back of the substrate 200 to control substrate temperatures. In some embodiments, the backside gas is only applied to the substrate 200 when chucking voltage is applied to the substrate 200. In some embodiments, the backside gas may be argon, helium or the like.

In addition to the foregoing, additional process parameters may be regulated while depositing the barrier layers 216, 218 to the desired thickness. In some embodiments, the substrate temperature may be maintained at about 18 degrees Celsius to about 500 degrees Celsius, such as at about 20 degrees Celsius to about 300 degrees Celsius. The processing time may be set at a predetermined processing period or after a desired thickness of the barrier layers 216, 218 are deposited on the substrate 200. In some embodiments, the processing time may be about 1 to about 180 seconds, such as about 5 to about 50 seconds.

Upon completion of the deposition of the barrier layers 216, 218, the process ends and the substrate 200 may be further processed as required for a particular application. For example, a metal layer (222 shown in FIG. 2F) may be deposited into the feature 210, atop the barrier layers 216, 218. In some embodiments, for example, the conductive layer 204, barrier layers 216, 218, and metal layer 222 may form at least part of a metal interconnection structure on the substrate 200. The metal layer 222 may comprise copper (Cu), aluminum (Al), tungsten (W), alloys thereof, or the like, or combinations thereof. The metal layer 222 may be deposited by any suitable manner, such as by electroplating, CVD, PVD, ALD, or the like.

In some exemplary embodiments, the first conductive layer 204 may be a copper layer (Cu), the barrier layers 216, 218 may be titanium nitride (TiN), and the metal layer 216 may be an aluminum layer (Al) and may form an interconnection structure on the substrate 200. In such embodiments, a copper (Cu) and aluminum (Al) hybrid interconnect structure with an improved and robust barrier layer is accordingly formed on the substrate 200. The improved barrier layer provides a stable, dense layer having good barrier properties that facilitate preventing the underlying first conductive layer (e.g., 204) from diffusing into the second conductive layer (e.g., 216) or adjacent dielectric layer (e.g., 208) while maintaining the via and/trench resistivity at a desired range. The copper (Cu) and aluminum (Al) hybrid interconnection structure may be used, for example, in flash memory backend interconnection (BEOL) processes.

In some embodiments, FIGS. 2A-F respectively depict a non-limiting exemplary embodiment of stages of fabrication of barrier layers 216, 218 on a substrate 200 suitable for use in fabricating an interconnect structure. As shown in FIG. 2A, a dielectric bulk insulating layer 208 and an underlying dielectric barrier layer 206 may be stacked on a previously formed interconnect having a first conductive layer 204 embedded in another dielectric bulk insulating layer 202.

The dielectric bulk insulating layers 208, 202 may comprise dielectric materials having a dielectric constant less than 4.0 (e.g., low-k materials). Non-limiting examples of suitable dielectric materials include carbon-containing silicon oxides (SiOC), such as BLACK DIAMOND® dielectric material available from Applied Materials, Inc., and other low-k polymers, such as polyamides. In some embodiments, the dielectric bulk insulating layers 208, 202 are carbon-containing silicon oxide (SiOC) layers.

In some embodiments, the dielectric barrier layer 206 may have a dielectric constant of about 5.5 or less. In some embodiments, the dielectric barrier layer 206 may comprise a carbon containing silicon layer (SiC), a nitrogen doped carbon containing silicon layer (SiCN), or the like. In some embodiments, the dielectric barrier layer 206 is a SiCN film. A non-limiting example of one suitable dielectric barrier layer material is BLOK® dielectric material, available from Applied Materials, Inc.

The first conductive layer 204 may be fabricated from a metal, such as copper, aluminum, tungsten, alloys thereof, or the like, or combinations thereof. A via/trench etching process may be performed to define a feature 210 in the dielectric bulk insulating layer 208 and the dielectric barrier layer 206, thereby exposing an upper surface of the first conductive layer 204.

As shown in FIGS. 2B and 2C, a first barrier layer 216 may be deposited on the upper surface of the dielectric bulk insulating layer 208 and within the feature 210 (e.g., on sidewalls 201 of the feature 210 and on the upper surface of the first conductive layer 204). In some embodiments, the first barrier layer 216 may be formed to a thickness of about 190 to 210 Angstroms, although thinner and thicker layers may also be formed in accordance with the teachings provided herein. The first barrier layer 216 may be formed from a multitude of materials, such as titanium or titanium nitride, in accordance with the embodiments described herein. As shown in FIGS. 2D and 2E, a second barrier layer 218 may be deposited on the upper surface of the first barrier layer 216 and within the feature 210 (e.g., on sidewalls 201 of the feature 210 and on the upper surface of the first conductive layer 204). In some embodiments, the second barrier layer 218 may be formed to a thickness of about 190 to 210 Angstroms, although thinner and thicker layers may also be formed in accordance with the teachings provided herein. In some embodiments, the second barrier layer 218 may be formed of the same materials as the first barrier layer 216 or may be formed of different materials.

The thicknesses of each of the various layers may be about 10 Angstroms to about 2,000 Angstroms, or in some embodiments, about 50 Angstroms to about 500 Angstroms. However, thinner and thicker layers may also be formed in accordance with the teachings provided herein.

The inventive methods described herein may be performed in any suitable physical vapor deposition chamber, for example, as described below. FIG. 3 illustrates one embodiment of a physical vapor deposition chamber (process chamber 300) in which the invention may be practiced. Examples of suitable PVD chambers include the ALPS® Plus, SIP ENCORE® PVD, and the ENDURA® line of process chambers, all commercially available from Applied Materials, Inc., of Santa Clara, Calif. Other process chambers, including those from other manufactures, may also be utilized to perform the present invention.

In some embodiments, the process chamber 300 contains a substrate support pedestal 352 for receiving the substrate 200 thereon, and a sputtering source, such as a target 342. The substrate support pedestal 352 may be located within a grounded enclosure wall 350, which may be a chamber wall (as shown) or a grounded shield (not shown).

The target 342 may be supported on a grounded conductive aluminum adapter 344 through a dielectric isolator 346. The target 342 comprises a material to be deposited on the substrate 200 during sputtering, such as titanium when depositing a titanium nitride film in accordance with embodiments of the present invention.

The substrate support pedestal 352 has a material-receiving surface facing the principal surface of the target 342 and supports the substrate 200 to be sputter coated in planar position opposite to the principal surface of the target 342. The substrate support pedestal 352 may support the substrate 200 in a central region 340 of the process chamber 300. The central region 340 is defined as the region above the substrate support pedestal 352 during processing (for example, between the target 342 and the substrate support pedestal 352 when in a processing position). In some embodiments, the substrate support pedestal 352 may include a electrostatic chuck 212 that retains or supports the substrate 200 on the surface of the substrate support pedestal 352. In some embodiments, the substrate support pedestal 352 may include a chucking electrode 322 disposed within an electrostatic chuck 212. The chucking electrode 322 may be coupled to a chucking power source through one or more respective matching networks (not shown). The chucking power source 356 may be capable of producing up to 12,000 W at a frequency of about 2 MHz, or about 13.56 MHz, or about 60 Mhz. In some embodiments, the chucking power source 356 may provide either continuous or pulsed power. In some embodiments, the chucking power source may be a DC or pulsed DC source.

in some embodiments the DC voltage may be pulsed from a positive voltage to a negative voltage. In some embodiments, the time period where the DC voltage is at a positive voltage and the time period where the DC voltage is at a negative voltage may be the same, or in some embodiments, different. In some embodiments, the time period where the DC voltage is at a positive voltage and the time period where the DC voltage is at a negative voltage may each be about 10 micro-seconds to about 10 milliseconds. In some embodiments, the pulse frequency, e.g., the frequency of one "positive voltage/negative voltage" cycle, may be between about 100 Hz to about 100 kHz.

In some embodiments, the substrate support pedestal 352 may include one or more mechanisms for controlling the temperature of the substrate support surface and the substrate 200 disposed thereon. For example, one or more channels 324 may be provided to define one or more flow paths beneath the substrate support surface to flow a backside gas. The one or more channels 324 may be configured in any manner suitable to provide adequate control over temperature profile across the support surface and the substrate 200. In some embodiments, the backside gas may be supplied from a gas source 328 through a mass flow controller 326. The backside gas may be argon, helium, or the like.

The substrate support pedestal 352 is vertically movable through a bellows 358 connected to a bottom chamber wall 360 to allow the substrate 200 to be transferred onto the substrate support pedestal 352 through a load lock valve (not shown) in the lower portion of the process chamber 300 and thereafter raised to a deposition, or processing position as depicted in FIG. 3. One or more processing gases may be supplied from a gas source 362 through a mass flow controller 364 into the lower part of the process chamber 300. An exhaust port 368 may be provided and coupled to a pump (not shown) via a valve 366 for exhausting the interior of the process chamber 300 and facilitating maintaining a desired pressure inside the process chamber 300.

A controllable DC power source 348 may be coupled to the process chamber 300 to apply a negative voltage, or bias, to the target 342. In addition, in some embodiments, a negative DC self-bias may form on the substrate 200 during processing. In other applications, the substrate support pedestal 352 may be grounded or left electrically floating.

A rotatable magnetron 370 may be positioned proximate a back surface of the target 342. The magnetron 370 includes a plurality of magnets 372 supported by a base plate 374. The base plate 374 connects to a rotation shaft 376 coincident with the central axis of the process chamber 300 and the substrate 200. The magnets 372 produce a magnetic field within the process chamber 300, generally parallel and close to the surface of the target 342 to trap electrons and increase the local plasma density, which in turn increases the sputtering rate. The magnets 372 produce an electromagnetic field around the top of the process chamber 300, and magnets 372 are rotated to rotate the electromagnetic field which influences the plasma density of the process to more uniformly sputter the target 342.

The process chamber 300 further includes a grounded bottom shield 380 connected to a ledge 384 of the adapter 344. A dark space shield 386 is supported on the bottom shield 380 and is fastened to the shield 380 by screws or other suitable manner. The metallic threaded connection between the bottom shield 380 and the dark space shield 386 allows the two shields 380, 386 to be grounded to the adapter 344. The adapter 344 in turn is sealed and grounded to the aluminum chamber sidewall 350. Both shields 380, 386 are typically formed from hard, non-magnetic stainless steel.

The bottom shield 380 extends downwardly in an upper tubular portion 394 of a first diameter and a lower tubular portion 396 of a second diameter. The bottom shield 380 extends along the walls of the adapter 344 and the chamber wall 350 downwardly to below a top surface of the substrate support pedestal 352 and returns upwardly until reaching a top surface of the substrate support pedestal 352 (e.g., forming a u-shaped portion 398 at the bottom). A cover ring 302 rests on the top of the upwardly extending inner portion of the bottom shield 380 when the substrate support pedestal 352 is in its lower, loading position but rests on the outer periphery of the substrate support pedestal 352 when it is in its upper, deposition position to protect the substrate support pedestal 352 from sputter deposition. An additional deposition ring (not shown) may be used to shield the periphery of the substrate 200 from deposition.

The process chamber 300 may also be adapted to provide a more directional sputtering of material onto a substrate. In one embodiment, directional sputtering may be achieved by positioning a collimator 310 between the target 342 and the substrate support pedestal 352 to provide a more uniform and symmetrical flux of deposition material to the substrate 200.

The collimator 310 may rest on the ledge portion of the bottom shield 380, thereby grounding the collimator 310. The collimator 310 may be a metal ring and may include an outer tubular section and at least one inner concentric tubular section, for example, three concentric tubular sections 312, 314, 316 linked by cross struts 320, 318. The outer tubular section 316 rests on the ledge portion 306 of the bottom shield 380. The use of the bottom shield 380 to support the collimator 310 simplifies the design and maintenance of the process chamber 300. At least the two inner tubular sections 312, 314 are of sufficient height to define high aspect ratio apertures that partially collimate the sputtered particles. Further, the upper surface of the collimator 310 acts as a ground plane in opposition to the biased target 342, which facilitates keeping plasma electrons away from the substrate 200.

In some embodiments, a magnet 354 may be disposed about the process chamber 300 for selectively providing a magnetic field between the substrate support pedestal 352 and the target 342. For example, as shown in FIG. 3, the magnet 354 may be disposed about the outside of the chamber wall 350 in a region just above the substrate support pedestal 352 when in processing position. The magnet 354 may be an electromagnet and may be coupled to a power source (not shown) for controlling the magnitude of the magnetic field generated by the electromagnet.

A controller 330 is coupled to various components of the process chamber 300 for controlling the operation thereof and comprises a central processing unit (CPU) 332, a memory 334, and support circuits 336 for the CPU 332. The controller 330 may control the substrate processing apparatus directly, or via computers (or controllers) associated with particular process chamber and/or the support system components. The controller 330 may be one of any form of general-purpose computer processor that can be used in an industrial setting for controlling various chambers and sub-processors. The memory, or computer-readable medium, 334 of the CPU 332 may be one or more of readily available memory such as random access memory (RAM), read only memory (ROM), floppy disk, hard disk, flash, or any other form of digital storage, local or remote. The support circuits 336 are coupled to the CPU 332 for supporting the processor in a conventional manner. These circuits include cache, power supplies, clock circuits, input/output circuitry and subsystems, and the like. Inventive methods as described herein may be stored in the memory 334 as software routine that may be executed or invoked to control the operation of the process chamber 300 in the manner described herein. The software routine may also be stored and/or executed by a second CPU (not shown) that is remotely located from the hardware being controlled by the CPU 332.

Thus, methods of forming barrier layers while reducing damage to underlying substrate structures are provided herein. Such barrier layers may be advantageously used in various applications, such as for fabrication of semiconductor devices or integrated circuits.

While the foregoing is directed to embodiments of the present invention, other and further embodiments of the invention may be devised without departing from the basic scope thereof.

What is claimed is:

1. A method of processing a substrate within a process chamber having an electrostatic chuck to support a substrate in a processing region of the process chamber and a target disposed opposite the electrostatic chuck, wherein the target comprises a target material to be deposited on the substrate, the method comprising:
    disposing a substrate on the electrostatic chuck;
    providing a process gas to the processing region;
    igniting a plasma in the processing region from the process gas while the substrate is disposed on the electrostatic chuck with no chucking voltage provided to clamp the substrate to the electrostatic chuck;
    increasing a DC power applied to the target from a plasma ignition power to a deposition power of about 10 to about 120 kW at a rate of about 2 to about 6 kW/s;
    depositing target material on the substrate to form a first barrier layer while no chucking voltage is provided, wherein the target material is sputtered from the target via the plasma; and
    pulsing only a DC chucking voltage to the electrostatic chuck to draw sputtered target material to a bottom and sidewalls of a feature to form a second barrier layer, wherein the first barrier layer and the second barrier layer comprise the same materials.

2. The method of claim 1, further comprising depositing target material on the substrate to form a second barrier layer while pulsing a backside gas to the substrate to control substrate temperature levels wherein the target material is sputtered from the target via the plasma.

3. The method of claim 1, wherein the target material comprises at least one of titanium (Ti), tantalum (Ta), tungsten (W), or aluminum (Al).

4. The method of claim 2, wherein the backside gas comprises argon (Ar).

5. The method of claim 1, wherein igniting a plasma in the process region further comprises:
    applying the plasma ignition power of about 0.2 to about 5 kW to the target.

6. The method of claim 1, wherein depositing target material on the substrate further comprises:
    maintaining a pressure in the process chamber after plasma ignition for a period of time of about 3 to about 10 seconds prior to reducing the pressure in the process chamber.

7. The method of claim 6, wherein reducing the pressure in the process chamber further comprises:
    reducing the pressure to a pressure of about 2 to about 5 mTorr.

8. The method of claim 2, wherein pulsing a chucking voltage to the electrostatic chuck further comprises pulsing a DC voltage from a positive voltage to a negative voltage.

9. The method of claim 8, wherein pulsing the DC voltage comprises:
    providing the DC voltage at the positive voltage for a first period of time of about 10 microseconds to about 10 milliseconds; and
    providing the DC voltage at the negative voltage for a second period of time of about 10 microseconds to about 10 milliseconds.

10. The method of claim 8, wherein the pulsed DC voltage is pulsed at a frequency of about 100 Hz to about 100 kHz.

11. A method of processing a substrate within a process chamber having an electrostatic chuck to support a substrate in a processing region of the process chamber and a target disposed opposite the electrostatic chuck, wherein the target comprises a target material to be deposited on the substrate, the method comprising:

disposing a substrate on the electrostatic chuck;
providing a process gas to the processing region;
igniting a plasma in the processing region from the process gas while the substrate is disposed on the electrostatic chuck with no chucking voltage provided to clamp the substrate to the electrostatic chuck;
depositing a first layer of target material on the substrate while no chucking voltage is provided and while increasing a DC power applied to the target from a plasma ignition power to a deposition power of about 10 to about 120 kW at a rate of about 2 to about 6 kW/s, wherein the target material is sputtered from the target via the plasma; and
applying only a DC chucking voltage to the electrostatic chuck to draw sputtered target material to a bottom and sidewalls of a feature to form a second layer of target material while applying a backside gas to the substrate to control a temperature of the substrate, wherein the target material is sputtered from the target via the plasma, and wherein the deposited first layer of target material and the deposited second layer of target material are the same materials.

12. The method of claim 11, wherein the target material comprises at least one of titanium (Ti), tantalum (Ta), tungsten (W), or aluminum (Al).

13. The method of claim 11, wherein the backside gas comprises argon (Ar).

14. A method of processing a substrate within a process chamber having an electrostatic chuck to support a substrate in a processing region of the process chamber and a target disposed opposite the electrostatic chuck, wherein the target comprises a target material to be deposited on the substrate, the method comprising:

disposing a substrate on the electrostatic chuck;
providing a process gas to the processing region;
igniting a plasma in the processing region from the process gas while the substrate is disposed on the electrostatic chuck with no chucking voltage provided to clamp the substrate to the electrostatic chuck;
depositing a first layer of target material on the substrate while no chucking voltage is provided, wherein the target material is sputtered from the target via the plasma; and
applying only a DC chucking voltage to the electrostatic chuck to draw sputtered target material to a bottom and sidewalls of a feature to form a second layer of target materials while pulsing a backside gas to the substrate to control substrate temperature levels wherein the target material is sputtered from the target via the plasma, and wherein the first layer of target material and the second layer of target material are the same materials.

15. The method of claim 14, wherein the target material comprises at least one of titanium (Ti), tantalum (Ta), tungsten (W), or aluminum (Al).

16. The method of claim 14, wherein the process gas comprises argon (Ar).

* * * * *